United States Patent
Regier et al.

(10) Patent No.: US 8,653,840 B2
(45) Date of Patent: Feb. 18, 2014

(54) FAST CURRENT SATURATION RECOVERY FOR A DIGITAL SOURCE MEASURE UNIT (SMU)

(75) Inventors: Christopher G. Regier, Cedar Park, TX (US); L. Rolando Ortega-Pohlenz, Austin, TX (US)

(73) Assignee: National Instruments Corporation, Austin, TX (US)

( * ) Notice: Subject to any disclaimer, the term of this patent is extended or adjusted under 35 U.S.C. 154(b) by 448 days.

(21) Appl. No.: 13/154,255

(22) Filed: Jun. 6, 2011

(65) Prior Publication Data

US 2012/0306518 A1 Dec. 6, 2012

(51) Int. Cl.
*G01R 31/00* (2006.01)

(52) U.S. Cl.
USPC ...................................... 324/750.01

(58) Field of Classification Search
USPC ...................................... 324/750.01
See application file for complete search history.

(56) References Cited

U.S. PATENT DOCUMENTS

| | | | | |
|---|---|---|---|---|
| 5,579,236 | A * | 11/1996 | Tamamura et al. | 702/64 |
| 5,754,041 | A * | 5/1998 | Kaito et al. | 324/762.01 |
| 5,970,074 | A * | 10/1999 | Ehiro | 714/745 |
| 7,502,697 | B2 * | 3/2009 | Holmquist et al. | 702/60 |
| 7,903,008 | B2 * | 3/2011 | Regier | 341/142 |
| 2009/0015221 | A1 * | 1/2009 | Kodera | 323/279 |
| 2012/0306517 | A1 * | 12/2012 | Regier et al. | 324/750.01 |

OTHER PUBLICATIONS

"NI PXIe-4154: Battery Simulator Optimized for Mobile Device Test," National Instruments Corporation, Oct. 11, 2010, 4 pages.

* cited by examiner

*Primary Examiner* — Arleen M Vazquez
*Assistant Examiner* — Alesa Allgood
(74) *Attorney, Agent, or Firm* — Meyertons Hood Kivlin Kowert & Goetzel, P.C.; Jeffrey C. Hood

(57) ABSTRACT

A source-measure unit (SMU) may be implemented with respective digital control loops for output voltage and output current. The output voltage and output current may be measured with dedicated ADCs (analog-to-digital converters). The readings obtained by the ADCs may be compared to a setpoint, which may be set in a digital loop controller (DLC). The DLC may be used to produce an output to drive a DAC (digital-to-analog converter) until the output voltage and/or output current and/or a function thereof reach the respective desired levels. The DLC may perform a threshold check to determine if the output current is outside a specified measurable range, and generate an override signal to drive the DAC to rapidly return the output current to the measurable range. Once the current is within the measurable range, the DAC may once again be driven according to the respective digital control loops for the output voltage and the output current.

21 Claims, 6 Drawing Sheets

FAST CURRENT SATURATION RECOVERY FOR A DIGITAL SOURCE MEASURE UNIT (SMU)

INCORPORATION BY REFERENCE

U.S. Pat. No. 7,903,008 B2 is hereby incorporated by reference as though fully and completely set forth herein.

BACKGROUND OF THE INVENTION

1. Field of the Invention

This invention relates generally to measurement and data acquisition systems and, more particularly, to the design of digital source-measure units.

2. Description of the Related Art

Scientists and engineers often use measurement systems to perform a variety of functions, including measurement of a physical phenomena a unit under test (UUT) or device under test (DUT), test and analysis of physical phenomena, process monitoring and control, control of mechanical or electrical machinery, data logging, laboratory research, and analytical chemistry, to name a few examples.

A typical measurement system comprises a computer system, which commonly features a measurement device, or measurement hardware. The measurement device may be a computer-based instrument, a data acquisition device or board, a programmable logic device (PLD), an actuator, or other type of device for acquiring or generating data. The measurement device may be a card or board plugged into one of the I/O slots of the computer system, or a card or board plugged into a chassis, or an external device. For example, in a common measurement system configuration, the measurement hardware is coupled to the computer system through a PCI bus, PXI (PCI extensions for Instrumentation) bus, a GPIB (General-Purpose Interface Bus), a VXI (VME extensions for Instrumentation) bus, a serial port, parallel port, or Ethernet port of the computer system. Optionally, the measurement system includes signal-conditioning devices, which receive field signals and condition the signals to be acquired.

A measurement system may typically include transducers, sensors, or other detecting means for providing "field" electrical signals representing a process, physical phenomena, equipment being monitored or measured, etc. The field signals are provided to the measurement hardware. In addition, a measurement system may also typically include actuators for generating output signals for stimulating a DUT.

Measurement systems, which may also be generally referred to as data acquisition systems, may include the process of converting a physical phenomenon (such as temperature or pressure) into an electrical signal and measuring the signal in order to extract information. PC-based measurement and data acquisition (DAQ) systems and plug-in boards are used in a wide range of applications in the laboratory, in the field, and on the manufacturing plant floor, among others. Typically, in a measurement or data acquisition process, analog signals are received by a digitizer, which may reside in a DAQ device or instrumentation device. The analog signals may be received from a sensor, converted to digital data (possibly after being conditioned) by an Analog-to-Digital Converter (ADC), and transmitted to a computer system for storage and/or analysis. Then, the computer system may generate digital signals that are provided to one or more digital to analog converters (DACs) in the DAQ device. The DACs may convert the digital signal to an output analog signal that is used, e.g., to stimulate a DUT.

Multifunction DAQ devices typically include digital I/O capabilities in addition to the analog capabilities described above. Digital I/O applications may include monitoring and control applications, video testing, chip verification, and pattern recognition, among others. DAQ devices may include one or more general-purpose, bidirectional digital I/O lines to transmit and received digital signals to implement one or more digital I/O applications. DAQ devices may also include a Source-Measure Unit (SMU), which may apply a voltage to a DUT and measure the resulting current, or may apply a current to the DUT and measure the resulting voltage. SMUs are typically configured to operate according to what is commonly referred to as "compliance limits", to limit the output current when sourcing voltage, and limit the output voltage when sourcing current. In other words, a compliance limit on the measured signal may determine the (maximum) value of the sourced signal. For example, when applying a source voltage to a DUT and measuring current, a given current value (e.g. 1 A) specified as the compliance limit would determine the (maximum) input (source) voltage that might be provided to the DUT. In most cases compliance limits may depend and/or may be determined based on the DUTs, e.g. the maximum (absolute) value of the current that may flow into the DUT, or the maximum (absolute) value of the voltage that may be applied across the terminals of the DUT.

In the case of most SMUs, the setpoint (the desired output voltage when sourcing and regulating voltage, or the desired current value when sourcing and regulating current) and the compliance limits are typically programmable. SMUs are available to cover a variety of signal levels, from the microvolt (tV) range to the kilovolt (kV) range, and from the femtoampere (fA) range to the ampere (A) range. Some SMUs can deliver or dissipate significant power, while other SMUs may be operated at low power. The accuracy of SMUs is typically less than the accuracy of high-quality calibrators and/or digital multi meters (DMMs).

For quite a while, SMUs were implemented with precision digital-to-analog converters (DACs) used for programming the setpoint and compliance limits into an analog control loop. The output voltage across the output terminals of the SMU, or the output current flowing into the output terminal of the SMU were typically set using the analog control loops by comparing the outputs to the levels set by the DACs. Each output voltage or output current could be controlled separately, with only one of the analog control loops closed at any given time. Voltage values representative of current and voltage measurements were provided to an analog-to-digital (ADC) element. In some SMUs, separate ADCs (instead of a single ADC) were used to read the analog output voltage or the analog output current. These SMUs were generally limited in flexibility and high in complexity, resulting from requirements to minimize glitches during range switching. In order for the SMU to operate accurately, a high level of accuracy was required for the DACs and ADCs configured in the SMU.

A more recent trend has been to implement SMUs with a control loop configured in the digital domain. The output voltage and output current in such a configuration is measured with dedicated ADCs. When sourcing current, the current readings obtained by the ADCs are compared to a Current Setpoint, and when sourcing voltage, the voltage readings are compared to a Voltage Setpoint, to regulate the current and voltage outputs, respectively. The setpoints can be set, for example, in an FPGA (field programmable gate array) or DSP (digital signal processing) chip. The FPGA or DSP chip can be used accordingly to produce an output to drive a DAC until the output voltage and/or output current reach the respective desired levels. The SMU can be configured to source one type of signal while measuring another type of signal. For example, the SMU can be configured to measure the voltage across the terminals of a device under test (DUT), when sourcing (and regulating) a current to the DUT, and similarly, the SMU can be configured to measure the current flowing into the DUT, when sourcing (and regulating) the voltage applied across the terminals of the DUT.

Overall, SMUs designed with a digital control loop offer a number of advantages. For example, DAC errors can be corrected by the digital loop, reducing the accuracy requirements on the DAC, and the control algorithm may be as simple or as complex as desired, and may be configured ranging from a simple integrator to a nonlinear adaptive system, offering the potential to enhance stability and speed. However, in may cases, the operation of SMUs, and the specifically the response of SMUs to various loading events, and transient events in general still needs to be optimized.

Other corresponding issues related to the prior art will become apparent to one skilled in the art after comparing such prior art with the present invention as described herein.

SUMMARY OF THE INVENTION

In one set of embodiment, the SMU may be configured to check the measured entity (current or voltage) against specified compliance limits, which may effectively limit the magnitude of the sourced signal. The SMU may be configured to vary (lower) the regulated current or voltage from its respective setpoint, when the measured voltage or current, respectively, exceeds the value specified by the compliance limit. For example, if the setpoint for sourcing and regulating current is 1 A, and the voltage compliance limit is 5V, if sourcing a 1 A current in the DUT results in a measured voltage that exceeds 5V, the SMU may lower the current to below 1 A until the measured voltage no longer exceeds the allowed 5V. Similarly, if the setpoint for sourcing and regulating voltage is 5V, and the current compliance limit is 1 A, if sourcing a 5V voltage across the terminals of the DUT results in a measured current that exceeds 1 A, the SMU may lower the voltage to below 5V until the measured current no longer exceeds the allowed 1 A.

The readback values (for the measured current and/or voltage) may be obtained by averaging the current and/or voltage values received from analog-to-digital converters (ADCs). The averaging may be weighted to provide noise rejection advantages. Placing the control loop in the digital domain provides added flexibility, and a decrease in the accuracy requirements on the digital-to-analog converter (DAC) used to produce the control signal of the SMU. The digital control loop also offers the possibility of novel approaches for solving potential range-switching issues that may arise within the SMUs.

In one set of embodiments, an SMU may comprise output terminals configured to couple the SMU to a device, and further configured to convey an analog output signal to the device to effect an output current flowing into the device, and an output voltage across input terminals of the device. The SMU may include a first converter configured to generate a first digital value representative of the output current, a second converter configured to generate a second digital value representative of the output voltage, and a digital loop controller configured to receive the first digital value and the second digital value, and generate a digital control signal based on the first digital value and the second digital value to regulate a specified function of the output current and the output voltage to remain at a value corresponding to a setpoint. The specified function may be the output current, the output voltage, power, or resistance, to name a few. The first digital value, being representative of the output current, may correspond to a current measurement, and the second digital value being representative of the output voltage may correspond to a voltage measurement. The first digital value and second digital value may therefore effectively be used in measuring and/or controlling any function, which may be defined and/or processed in the digital loop controller. For example, multiplying the first digital value and the second digital value may provide a measurement of power. Accordingly, the digital control value may be generated by the digital loop controller to effect desired changes in the output current and/or the output voltage depending on what the selected function is. For example, if the selected function is power, then both the output current and output voltage may be regulated, or only one of the output current and output voltage may be regulated based on the measured output current and output voltage.

The digital loop controller may be used to produce a digital control signal to drive the DAC until the output voltage and/or output current and/or a function thereof reach the respective desired levels. In order to provide more effective and efficient response to various transient events on the output of the SMU, the digital loop controller may perform a threshold check to determine if the output current is outside a specified measuring range, which may represent a desired current range and measurement accuracy within that range. If the output current is outside this range, the digital loop controller may generate an override signal to drive the DAC to rapidly return the output current to the specified measuring range. Once the current is within the measuring range, the DAC may once again be driven according to the respective digital control loops for the output voltage and the output current. To ensure that the ADCs in the feedback loop do not remain saturated and to avoid unpredictable behavior resulting from a transient event on the output of the SMU, the digital loop controller may also implement a feed-forward algorithm to select between the override signal and the control signal based on the relative values of the control signal and override signal, and the direction of the output current, any time the output current is determined to be outside the specified measuring range.

BRIEF DESCRIPTION OF THE DRAWINGS

The foregoing, as well as other objects, features, and advantages of this invention may be more completely understood by reference to the following detailed description when read together with the accompanying drawings in which.

Figure 1:
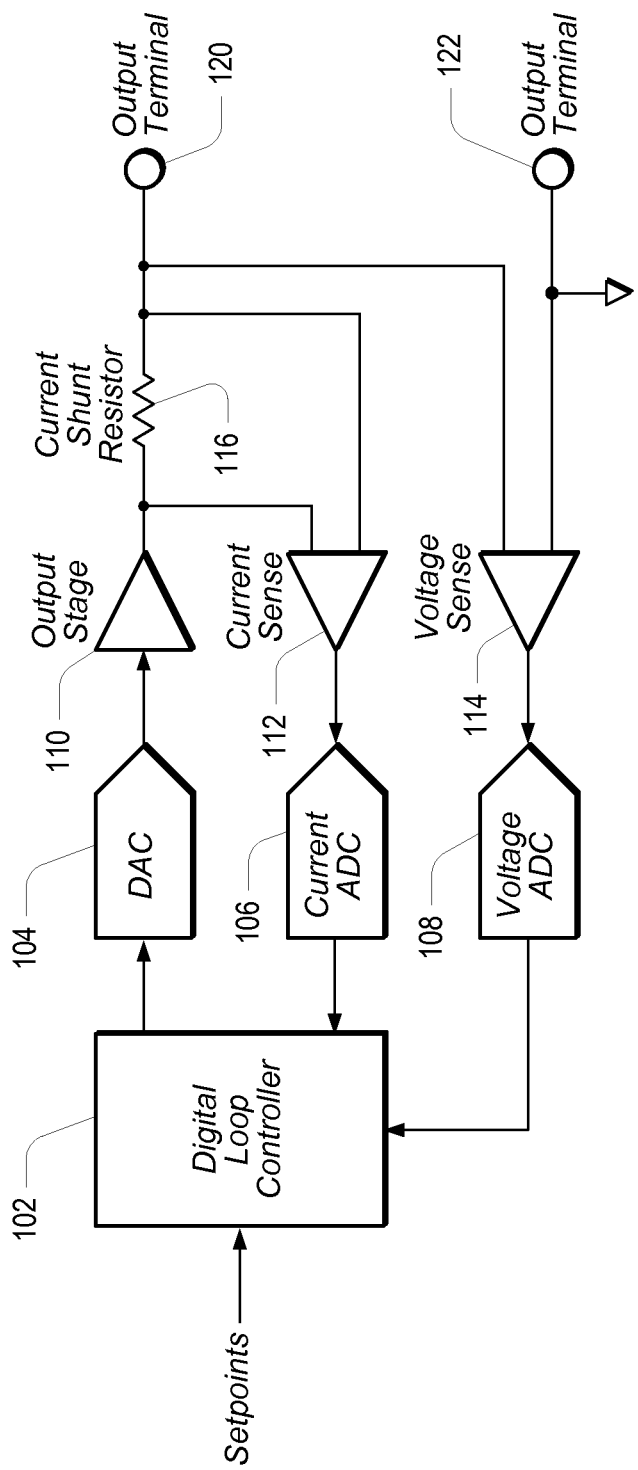
FIG. 1 shows the basic architecture of a prior art SMU featuring digital control loops and a digital loop controller.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "coupled" means "directly or indirectly connected".

DETAILED DESCRIPTION OF THE EMBODIMENTS

FIG. 1 shows the basic architecture of one embodiment of a prior art SMU (source-measure unit) in which the entire control loop has been configured in the digital domain. A DUT (device under test), not shown, may be coupled between output terminals 120 and 122. Setpoints and compliance limits may be provided (programmed) to Digital Loop Controller (DLC) 102, which may provide a control output through DAC (digital-to-analog converter) 104 to Output Stage 110. Feedback from Output Stage 110 may be provided to Current ADC (analog-to-digital converter) 106 and Voltage ADC 108 via respective Current Sense element 112 and Voltage Sense element 114. The current feedback may be taken from the current flowing through current shunt resistor 116, and the feedback voltage may be taken from across output terminals 120 and 122. Current ADC 106 and Voltage ADC 108 may then provide the readback current and voltage values into DLC 102.

DLC 102 may be configured to check the measured current (from Current ADC 106) resulting from a sourced voltage, against the specified current compliance limit provided (or programmed) into DLC 102. DLC 102 may similarly be configured to check the measured voltage (from Voltage ADC 108) resulting from a sourced current, against the specified voltage compliance limit provided (or programmed) into DLC 102. To regulate the output, DLC 102 may be configured to check the measured current (from Current ADC 106) resulting from a sourced current, against the specified current setpoint provided (or programmed) into DLC 102. DLC 102 may similarly be configured to check the measured voltage (from Voltage ADC 108) resulting from a sourced voltage, against the specified voltage setpoint provided (or programmed) into DLC 102.

The compliance limits may effectively limit the magnitude of the sourced signals. DLC 102 may be configured to vary (lower) the regulated current or voltage from its respective setpoint, when the measured voltage or current, respectively, exceeds the value specified by the compliance limit. For example, if the setpoint for sourcing and regulating current is 1 A, and the voltage compliance limit corresponding to a given DUT is 5V, when sourcing a 1 A current in the DUT results in a voltage measurement that exceeds 5V, DLC 102 may operate to lower the value of the sourced current below 1 A, until a sourced current value is reached for which the measured voltage no longer exceeds the allowed 5V. Similarly, if the setpoint for sourcing and regulating voltage is 5V, and the current compliance limit corresponding to a given DUT is 1 A, when sourcing a 5V voltage across the terminals of the DUT results in a current measurement that exceeds 1 A, DCL 102 may operate to lower the value of the sourced voltage below 5V, until a sourced voltage value is reached for which the measured current no longer exceeds the allowed 1 A.

The digital loop controller (e.g. DLC 102) may provide the added flexibility of being able to operate the SMU for different compliance limits, (and being able to program multiple setpoints), without additional components. In addition, the loop bandwidth may easily be adjusted by changing the controller coefficients, and control loop adjustments may be made through measurable and controllable settling times of the signal. The DLC may also be reconfigurable to the desired mode, controlling/generating current, voltage, power, resistance, or voltage with series impedance, which may be valuable in battery simulation applications.

In one set of embodiments, DLC 102 may be implemented with an ASIC, a DSP, an FPGA, or any other suitable digital circuitry configured to perform the designated functions of DLC 102. An FPGA may be preferable for implementations utilizing National Instruments' LabVIEW graphical programming interface to write and simulate the control code. When using an FPGA with LabVIEW, the control code may be deployed and tested through LV-FPGA (LabVIEW FPGA). The control system itself may be designed to emulate a traditional SMU, while allowing users to implement more advanced features by writing their own control algorithm (for example in LV-FPGA when using LabVIEW and an FPGA). Some embodiments may also implement more advanced features such as constant power delivery or sinking, or constant resistance generation. For safety considerations, especially in user-configured situations, the output of DAC 104 may be limited to a safe level, regardless of feedback.

It should also be noted that when trying to regulate power, for example, two ADCs may be required for obtaining the requisite measurements for the power regulation to be performed. One ADC may be required to measure current (e.g. ADC 106) and another ADC may be required to measure voltage (e.g. ADC 108), with the multiplication (to obtain the power value that may be compared to a setpoint) performed digitally, in DLC 102, for example. Thus, certain embodiments, where the sourced and measured entity is the same (e.g. sourcing current and measuring current), may be configured with a single ADC. In one set of embodiments, when only always one entity (e.g. Current or Voltage) is to be measured, one of the ADCs may simply be removed. In another set of embodiments, the output from the Current Sense element and the output of the Voltage Sense element may be input to a multiplexer (not shown in any of the figures), which may be used to select whether sensed voltage or sensed current is to be converted to the digital value provided to the digital loop controller. These embodiments may be useful, for example, in certain applications where compliance limits were unnecessary, and/or the primary functionality was regulation of the output.

In one set of embodiments, the control algorithm (which may be implemented in DLC 102) may be a PID (proportional integral derivative) controller or a variant thereof. In yet other embodiments the control algorithm may be based on fuzzy logic, or it may be nonlinear. The control algorithm may additionally be devised as an adaptive algorithm. In certain embodiments it may be configured to include programmable speed/stability tradeoff. For example, as a simple substitute for an adaptive control algorithm, the speed/stability tradeoff may be exposed to the users, who may be able to choose stable/normal/fast with any degree of resolution to match their expected test setup. The control system may also be designed to optimally handle different responses to varying load conditions. For example, sudden load changes typically require a fast response from SMUs. When load changes cause a temporary flow of current that exceeds the measurement range of the feedback circuitry configured to measure the current (e.g. the feedback loop that includes ADC 106 in FIG. 1), the recovery is unusually slow, or may not happen at all, as the condition may lead to latch-up. This issue may also negatively and visibly affect SMUs featuring a digital feedback loop(s), such as the one shown in FIG. 1 for example.

Figure 2:
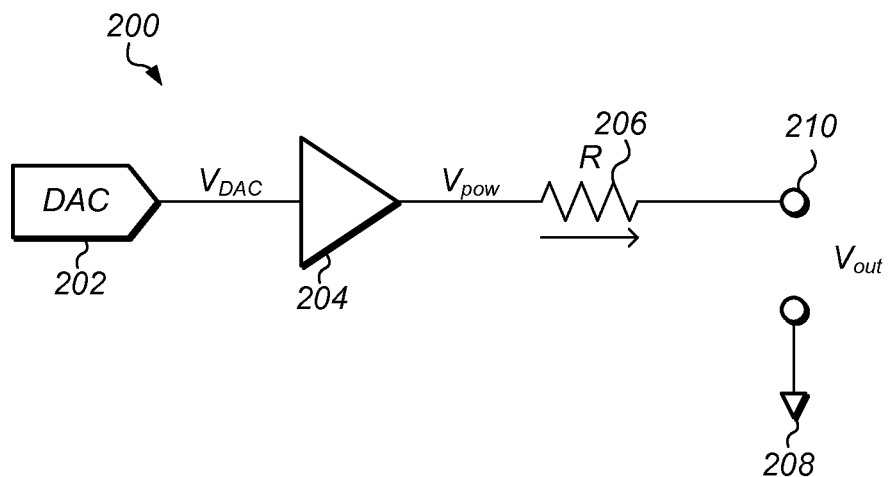
FIG. 2 shows a simplified circuit diagram of one embodiment of the forward stage of the SMU shown in FIG. 1, for an open output.

By way of example, to provide analysis, FIG. 2 shows a simplified circuit/block diagram 200 that models the forward path including the DAC and output stage of an SMU, such as the SMU shown in FIG. 1. The SMU may be configured to provide a specified output voltage at a specified current limit for the current flowing through shunt resistor 206. For example, the digital SMU may have a voltage setpoint of 10V, to output 10V as $V_{out}$, with a 100 mA current limit for the current in shunt resistor 206. As shown in FIG. 2, the output may be disconnected from ground 208 (i.e. the output may be open) as shown. A digital loop controller (e.g. DLC block 102 in FIG. 1) may provide the input signal into DAC 202, which may couple to a power stage 204 in front, providing an output voltage $V_{DAC}$ to power stage 204. Power stage 204 may apply a gain to $V_{DAC}$, and generate amplified output voltage $V_{pow}$. The digital loop controller may adjust $V_{DAC}$ according to the digital control loop, such that $V_{out}$ matches its setpoint of 10V. Therefore, $V_{out}=10V$. Since the output is disconnected, the current flowing in shunt resistor 206 (having a value R) is zero. Since the current is zero, there is no voltage drop across the shunt, resistor 206, which means that $V_{pow}=V_{out}=10V$.

Figure 3:
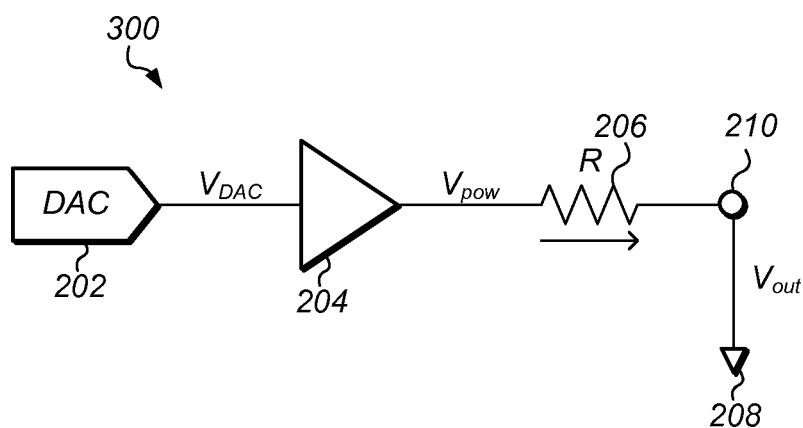
FIG. 3 shows a simplified circuit diagram of one embodiment of the forward stage of the SMU shown in FIG. 1, for a shorted output.

Should the output be shorted for any reason, $V_{out}$ would change from a value of 10V to zero volts (0V). This is shown in FIG. 3, where output node 210 is now shorted to voltage reference (or ground) 208, causing the output voltage $V_{out}$ to fall to 0V. Immediately following the occurrence of the short, $V_{pow}$ may briefly remain at 10V. Therefore, the voltage across shunt resistor 206 may also become about 10V, and a current may flow through shunt resistor 206. The current flowing through shunt resistor 206 is determined by $(V_{pow}-V_{out})/R$. For example, if the value R is 10Ω, an instant current 10V/10Ω=1 A may flow through shunt resistor 206. In one set of embodiments, upon detecting this, the loop controller may enter Constant Current mode (CCM) and quickly correct for the extra current, providing what is referred to herein as the Transient Response. However, the circuitry implementing the current measurement may have a limited measurement range, optimized to provide higher measurement resolution and accuracy instead. In other words, the current compliance for the SMU may be set to, for example, 100 mA as in this present example, while at the time the output is shorted, a 1 A current may be flowing through shunt resistor 206. More generally, the current flowing through shunt resistor 206 during such a transient event might be magnitudes (e.g. 10×) higher than the current compliance limit of the SMU. The measurable voltage across shunt resistor 206 may be specified to be 1.5V, which may allow for measurements that slightly exceed the specified 1V limit (which corresponds to 100 mA when R=10Ω), which allows measuring a current of up to 100 mA (10Ω*100 mA=1V drop).

When having to measure a high voltage (e.g. 10V) drop across shunt resistor 206, the measurement circuitry—configured and optimized for specified voltage and current measurement values/limits, as described above—may saturate to the specified maximum allowed voltage for current measurement, e.g. 1.5V as in the present example, and report a corresponding current value as also determined by the value of shunt resistor 206, e.g. 150 mA as in the present example, to the digital loop controller (e.g. in DLC 102). Therefore, the DLC may perceive a smaller than actual error, e.g. a 50% error as in the present example, between the 100 mA setpoint and the assumed 150 mA output, while in reality the error is 900%. Accordingly, the control loop response may be slower than desired. The digital loop controller may reduce $V_{DAC}$ to affect $V_{pow}$—and therefore reduce the current flowing through shunt resistor 206—in increments corresponding to a 50 mA error, continually detecting a constant 50% error until the current eventually falls under the saturation threshold. At that point, the digital loop controller may operate as expected. However, such an error correction process effects a linear recovery, rather than following an expected exponential curve, potentially resulting in a much longer than expected recovery time, which may expose the instrument and the DUT to hazardous conditions.

Figure 4:
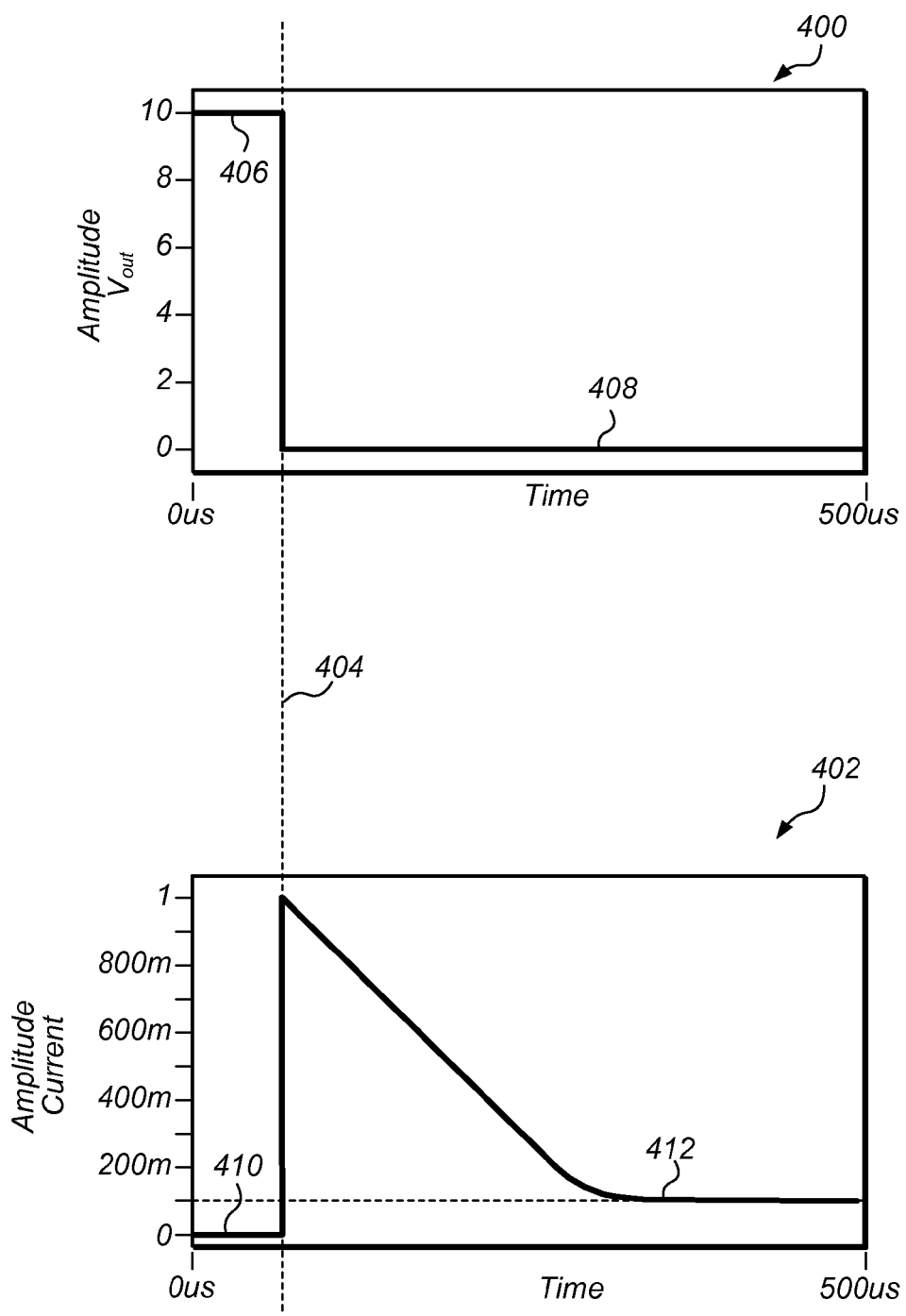
FIG. 4 shows one example of the output voltage and shunt current response for the forward stage of the SMU when going from an open output to a shorted output.
Figure 5:
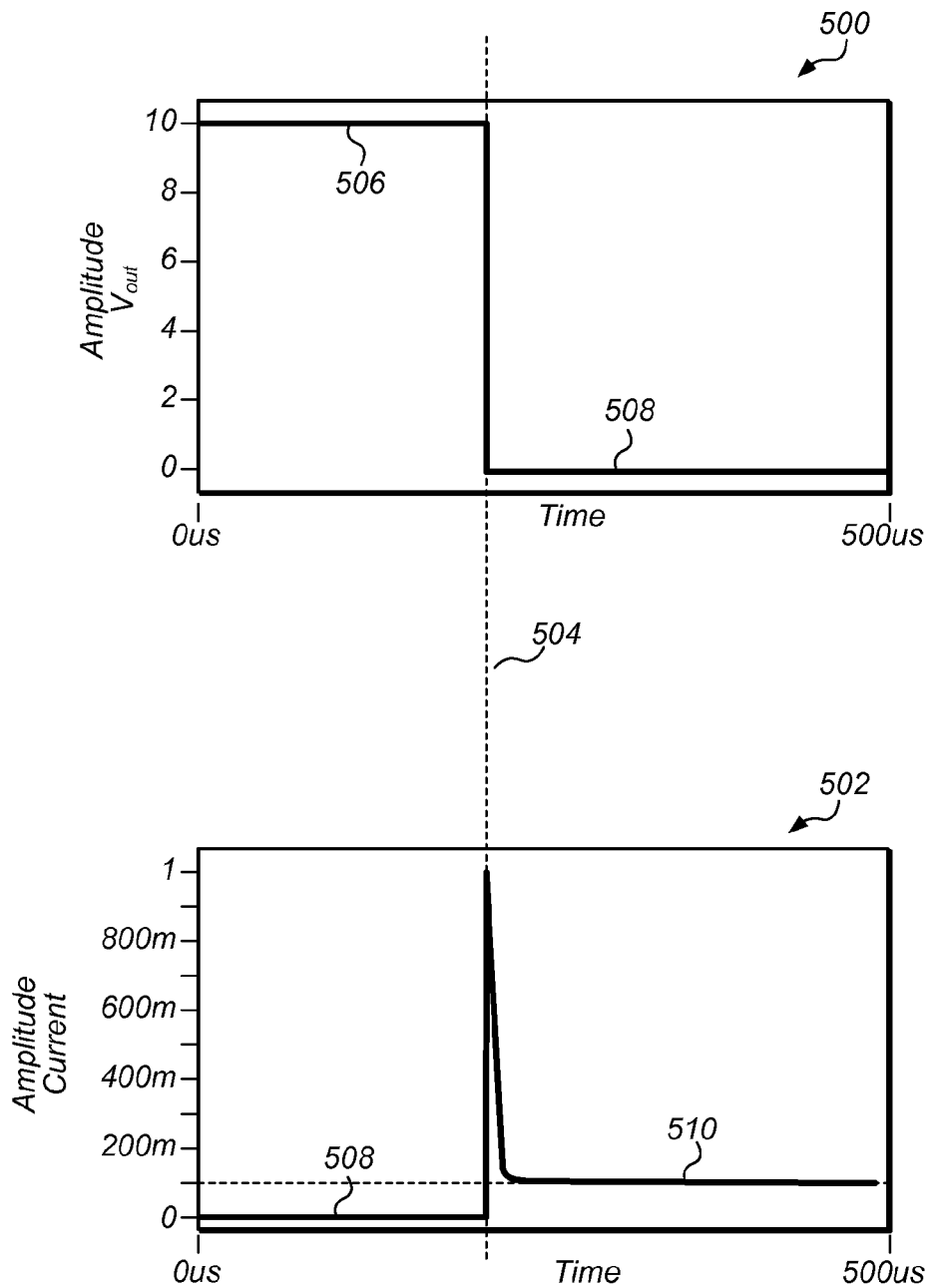
FIG. 5 shows one example of the output voltage response and preferred shunt current response for the forward stage of the SMU when going from an open output to a shorted output.

The behavior of the output voltage $V_{out}$ and the current flowing through shunt resistor 206 are illustrated in FIG. 4 by diagrams 400 and 402, respectively. In diagram 400, the instant value of $V_{out}$ is plotted over a 500 μs window, in which a short is introduced at time point 404. As seen in diagram 400, $V_{out}$ first resides at 10V, when the output is open, represented by line segment 406. At time point 404, the output is shorted, resulting in $V_{out}$ falling to 0V, represented by line segment 408. In diagram 402, the instant value of the current flowing through shunt resistor 206 is plotted over the same 500 μs window. As seen in diagram 402, the current flowing through shunt resistor 206 is at first 0 A, represented by line segment 410. However, the current spikes as soon as the output is shorted, and recovers in a relatively slow, linear fashion, represented by curve 412. It is desirable to effect a faster recovery, which may benefit both the device and the user. This desired behavior is illustrated in FIG. 5.

In diagram 500, the instant value of $V_{out}$ is again plotted over a 500 μs window, in which a short is introduced at time point 504. As seen in diagram 500, $V_{out}$ first resides at 10V, when the output is open, represented by line segment 506. At time point 504, the output is shorted, resulting in $V_{out}$ falling to 0V, represented by line segment 508. In diagram 502, the instant value of the current flowing through shunt resistor 206 is plotted over the same 500 μs window. As seen in diagram 502, the current flowing through shunt resistor 206 is at first 0 A, represented by line segment 508. However, the current spikes as soon as the output is shorted, but this time recovers in a relatively fast, exponential fashion, represented by curve 510. The current flowing through shunt resistor 206 may remain at the high value for some (small) amount of time, but the length of time, or duration of the excessive amount of current may be considerably reduced. A shorter recovery period may be realized in a variety of ways, some embodiments of which are discussed below.

In one set of embodiments, a digital threshold check may be implemented to determine whether the measurement circuitry for the current (eg. the feedback loop that includes ADC 106 in FIG. 1) has saturated. The digital thresholds may correspond to, or may be associated with readings that are meant to indicate that the ADC readings for the current flowing through shunt resistor 206 have saturated or are very close to saturation. In other words, they may be indicative of the current flowing through shunt resistor 206 having reached a maximum value (based on maximum voltage, i.e. voltage across shunt resistor 206 associated with the current). Thus, the thresholds may be specified to indicate which ADC readings are above a certain positive threshold or below a certain negative threshold, either of which is indicative of the current having reached a saturation point. To put it another way, an operating range associated with the current flowing through shunt resistor 206 during normal operation may be specified, and if the measured current falls outside that range, the threshold check may indicate that the ADC reading (i.e. value from ADC 106) has saturated. If these thresholds (or operating range) are specified to be sufficiently higher/lower than the values expected during normal operation, the comparison may be functionally equivalent to having actually detected saturation. In one set of embodiments, this may be performed as part of the function of the digital loop controller, e.g. DLC 102.

Figure 6:
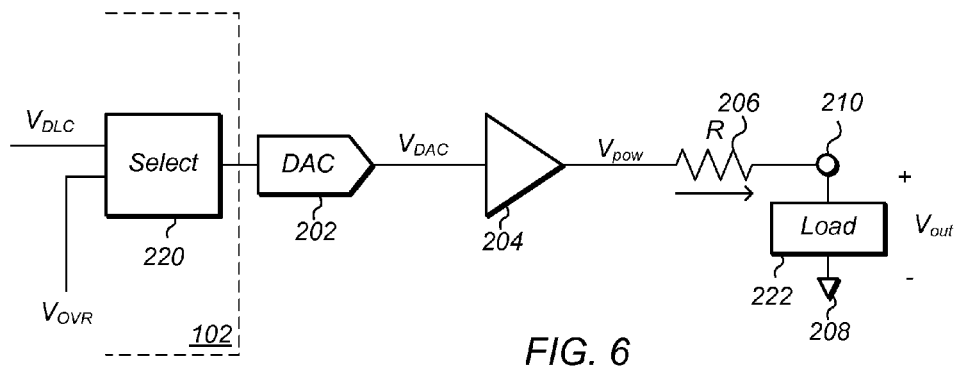
FIG. 6 shows a simplified circuit diagram of one embodiment of a forward stage of the SMU with override to obtain a preferred shunt current response during a transient event on the output.

Once saturation has been detected, a feed-forward behavior may be implemented to create a more adequate response by overriding the output generated by the digital loop controller, which may attempt to generate an output in line with normal operation. An illustration of such a feed-forward override feature is shown in FIG. 6. Considering the forward path and output of the SMU (as also similarly illustrated in FIGS. 2 and 3), an override/selection mechanism 220 may be included in DLC 102, in which the desired voltage value (i.e. the digital value corresponding to the desired control voltage) may be selected from either the DLC generated value for normal operation ($V_{DLC}$), and an override voltage $V_{OVR}$. $V_{OVR}$ may correspond to a desired voltage value when handling a transient response, for example when a load 222 is attached to what had previously been an open output, as described above with reference to changing the state of the SMU from what is shown in FIG. 2 to what is shown in FIG. 3. The override voltage $V_{OVR}$ may be determined by making use of the actual measured output voltage, as will be further described below. Thus, under normal operating conditions the value of $V_{DLC}$ generated by DLC 102 may be provided to DAC 202, while during transient events, selection mechanism 220 may be used to override that value and provide $V_{OVR}$ to DAC 202 instead, to generate $V_{DAC}$.

The goal to achieve a speedy response may be to force $V_{DAC}$ to a value that results in a $V_{pow}$ value that returns the current flowing through shunt resistor 206 to within measurable range of the current feedback path. The voltage feedback path (e.g. the feedback path formed by voltage sense element 114 and ADC 108 in FIG. 1) may be used to determine what the value of $V_{out}$ is, which, in case the output has been shorted, may be 0V. Since the current flowing through shunt resistor 206 is equal to $(V_{pow}-V_{out})/R$, an appropriate value of $V_{DAC}$ that would return the current into measurable range may be determined. There's a linear relationship between $V_{DAC}$ and $V_{pow}$, and the value of $V_{out}$ and the (constant) value of R are both known. Considering $V_{range}$ to be the maximum voltage that can be measured by the current feedback circuitry (e.g. the feedback path formed by current sense element 112 and current ADC 106), the override voltage may be specified/selected to target a $V_{DAC}$ value such that $V_{pow}=V_{out}+ (V_{range}*k*sign(i))$, where 'i' represents the current flowing through shunt resistor 206, and k is a factor having a value that is close to 1, which may provide a margin guaranteeing that the current stays within the desired range. Sign(i) has a value of '1' when the current is positive, and a value of '−1' when the current is negative. This may work equally well, when instead of being shorted to ground, the output is shorted to a powerful power source that provides a voltage $V_{out}$ where the current saturates. This may happen, for example, when the SMU is configured to provide a regulated output voltage of 0V, and is connected to a 10V source that has very low output impedance.

It should be noted that if the introduced load is not a short or a "strong" power source, as discussed above, but is rather a low-value resistor, the value of $V_{out}$ may be determined from a voltage division across shunt resistor 206, and the low-value load resistor. In such a case, when an attempt is made to force $V_{pow}$ to $V_{out}$, the circuit may not necessarily move out of saturation on the first try (as $V_{out}$ gets smaller in proportion to $V_{pow}$, making $V_{pow}-V_{out}$ larger than desired). However, an iterative application of the feed-forward mechanism may return control, and do so faster than the digital loop controller may achieve on its own. In other words, by iteratively applying the feed-forward correction mechanism, a desired or preferred shunt current response may be achieved, in which the behavior of the current flowing through shunt resistor 206 may follow the behavior of a curve such as curve 510 in diagram 502, instead of the linear curve 412 seen in diagram 402.

In order to achieve the desired or preferred response, ADC counts (for $V_{out}$) may be converted, using gains, into $V_{DAC}$ counts that correspond to the desired $V_{pow}$, as well as some specified constants for the offset ($V_{range}*k$). In this case, the gain refers to scaling coefficients between the DAC codes and ADC codes. For example, 10V might correspond to an ADC code of 20,000 and a DAC code of 10,000. In this case, the ADC codes may be converted into DAC codes using a "gain" of 0.5. The gains and constants may be calibrated, but in some embodiments calibration may not be required, as good approximations for gains and offsets may generally be sufficient. It should be noted that forcing $V_{pow}$ to a fixed value whenever the current ADC (e.g. ADC 106) saturates may lead to difficulties, especially when using uncalibrated values. For example, if the voltage were set high enough for the ADC to remain saturated, it may not exit saturation. Alternatively, a voltage value that is too small may lead to oscillating behaviors. This may be avoided by implementing a "soft" feed-forward algorithm. One embodiment of such a feed-forward algorithm is illustrated in the flowchart shown in FIG. 7.

If a threshold check indicates that the ADC (e.g. current ADC 106) is saturated ('Yes' branch of 702), that is, the current flowing through the shunt resistor is out of range, then the direction of the current may be determined (704). If the current is positive ('Yes' branch of 704), then the regular controller output may be compared to the calculated override output (708). If the override output is less than the controller output ('Yes' branch of 708), then the override output may be used and provided to DAC 202, to generate $V_{DAC}$ (712). If the override output is not less than the controller output ('No' branch of 708), then the controller output may be used and provided to DAC 202, to generate $V_{DAC}$ (706). If the current is negative ('No' branch of 704), then the regular controller output may be compared to the calculated override output (710). If the override output is greater than the controller output ('Yes' branch of 710), that is, it is more positive with a lower absolute value than the controller output, then the override output may be used and provided to DAC 202, to generate $V_{DAC}$ (712). If the override output is not greater than the controller output ('No' branch of 710), then the controller output may be used and provided to DAC 202, to generate $V_{DAC}$ (706).

Figure 7:
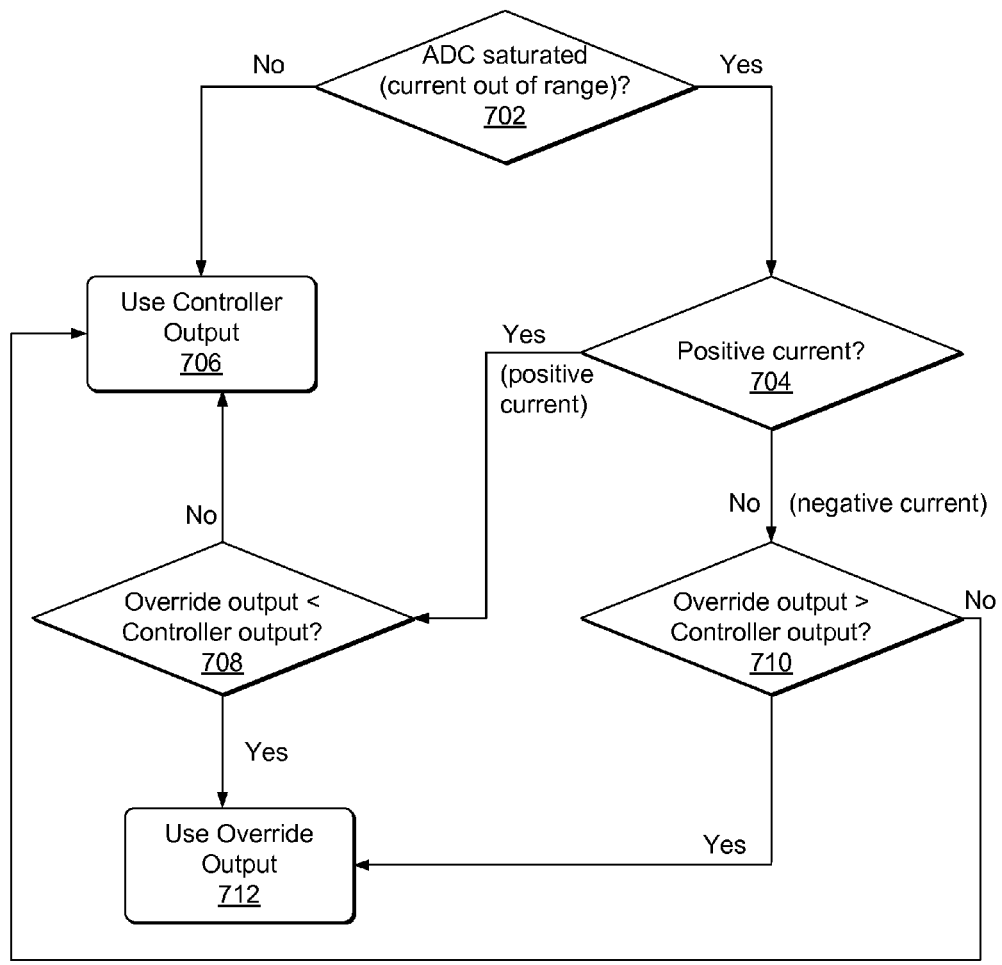
FIG. 7 shows a flow diagram implementing one embodiment of a feed-forward algorithm to select a voltage applied to the output stage of the forward stage of the SMU.
Figure 8:
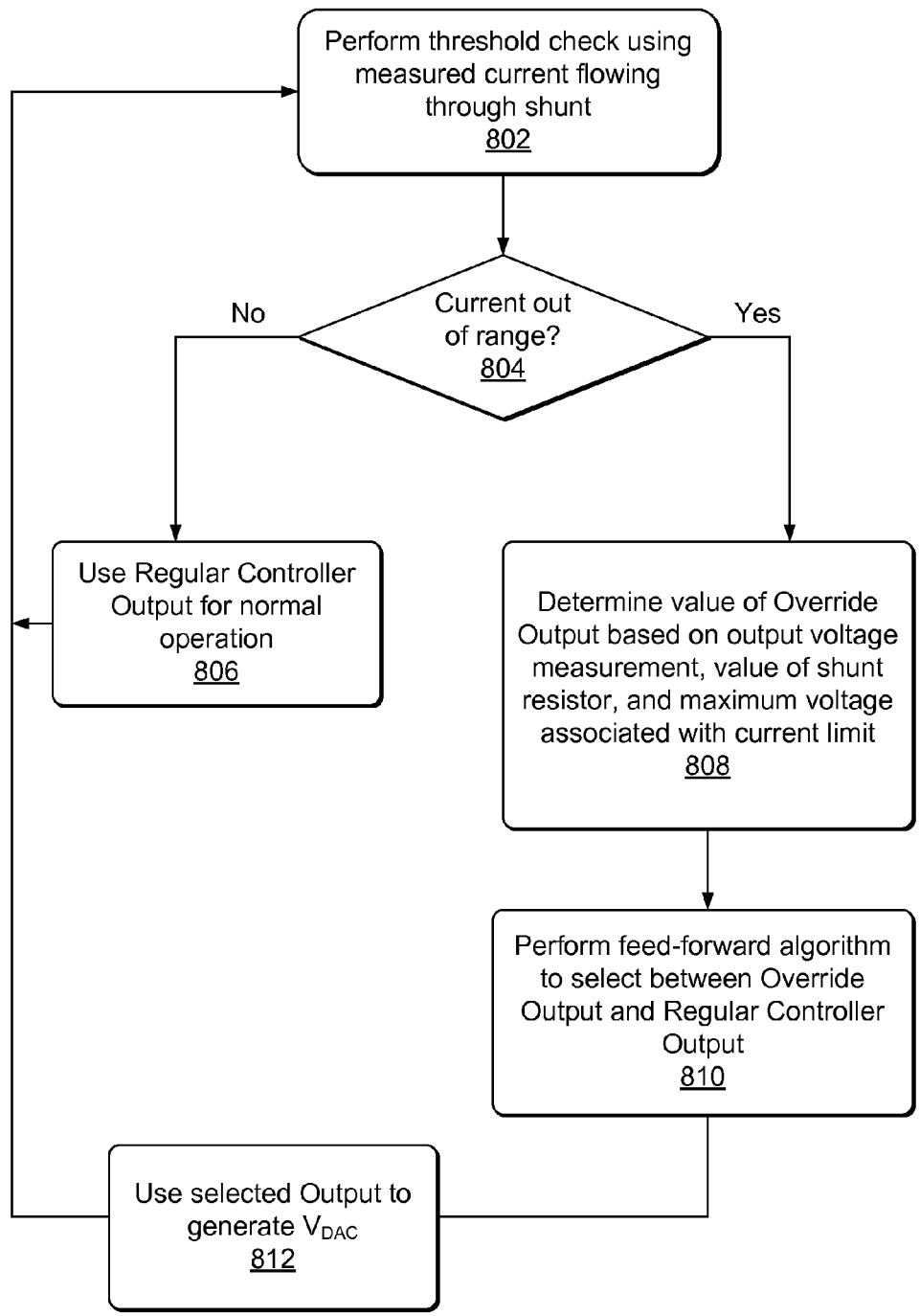
FIG. 8 shows a flow chart of one embodiment of an algorithm implementing digital loop control that includes a specified response to a transient event, for a digital SMU.

Thus, the overall digital loop control that includes a specified response to a transient event on the output of the SMU, for example when attaching a load or shorting the output as previously described, may be summarized according to one embodiment, as show in the flowchart of FIG. 8. A threshold check may be performed using the measured current flowing through the shun, which may be obtained through a current feedback loop such as the feedback loop including ADC 106 and current sense element 112 in the SMU shown in FIG. 1 (802). If the threshold check indicates that the current is out of range ('Yes' branch of 804), which may include the case of the measured current value not being representative of the actual current flowing through the shunt, then an override output value may be determined based on the measured value of the output voltage, which may be obtained through a voltage feedback loop such as the feedback loop including ADC 108 and voltage sense element 114 in the SMU shown in FIG. 1, the value of the shunt (e.g. shunt resistor), and the maximum voltage associated with the specified current limit, i.e. the voltage developed across the shunt and corresponding to the maximum specified current flowing through the shunt (808). A feed-forward algorithm, one embodiment of which is shown in FIG. 7, may then be performed to select between an override output and a regular controller output, to drive the DAC in the forward path of the SMU (810). The selected output value may then be used to generate $V_{DAC}$ (812), and the threshold check may be performed during the next measurement (802).

As an alternative to setting a fixed voltage across shunt resistor 206 as described above, a specified $V_{DAC}$ value may be provided to obtain a $V_{pow}$ value that brings the current flowing through shunt resistor 206 very close to the specified (i.e. expected) setpoint. This may further accelerate the recovery behavior of the circuit (i.e. the recovery of the current measuring loop), and the mechanism may be calibrated to obtain the desired precision. In other words, whenever the current measurement indicates that the current measurement loop is saturated, the reported current value may be replaced by a current value determined based on the regular controller output (i.e. the value provided to DAC 202 from the digital control loop according to the current measurement, and not an override value), the measured voltage, and the value of shunt resistor 206. Referring to FIGS. 1 and 6, the current measurement may be replaced in this case with the calculated current $i_{calc} = (V_{DLC} - V_{ADC\_108})/R$, where $V_{ADC\_108}$ is the measured output voltage returned by ADC 108.

Finally, to make sure that no windup occurs in the integrating term of the digital loop controller, the integrated value may be forced to match whichever output is selected (between the override value and the regular controller value). The integrator may therefore always track the actual output, and the controller doesn't glitch when it returns to normal operating mode, once the transient response has been handled. Any filtering or other signal-processing elements within the DLC that have memory may be similarly inhibited and/or adjusted to prevent undesired reactions as a result of the feed-forward action.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

We claim:

1. A source-measure unit comprising:
    output terminals configured to couple the source measure unit to a device under test, and further configured to convey an analog output signal to the device under test to effect:
        an output current flowing into the device under test; and
        an output voltage in the device under test;
    a first converter configured to generate a first digital value representative of the output current;
    a second converter configured to generate a second digital value representative of the output voltage; and
    a digital loop controller configured to:
        receive the first digital value and the second digital value;
        generate a digital control signal based on the first digital value and the second digital value;
        determine based on the first digital value whether the output current is outside a specified measuring range;
        if it is determined that the output current is outside the specified measuring range, generate a digital override signal, and select one of the digital control signal and the digital override signal to obtain a selected digital signal used to adjust the analog output signal, wherein the selected digital signal effects a desired return of the output current into the specified measuring range.

2. The source measure unit of claim 1, wherein the digital loop controller is configured to generate the digital override signal based on one or more of:
    the second digital value;
    a maximum voltage value associated with the specified measuring range;
    a shunt element coupled between one of the output terminals and the digital loop controller to conduct the output current;
    a specified override value;
    a previous value of the digital control signal; or
    a current value of the digital control signal.

3. The source measure unit of claim 1, wherein the digital loop controller is configured to:
    select the digital override signal when the output current is positive and the digital override signal is less than the digital control signal;
    select the digital override signal when the output current is negative and the digital override signal is greater than the digital control signal;
    select the digital control signal when the output current is positive and the digital override signal is not less than the digital control signal; and
    select the digital control signal when the output current is negative and the digital override signal is not greater than the digital control signal.

4. The source measure unit of claim 1, further comprising a digital-to-analog converter configured to receive the selected digital signal and generate a corresponding analog signal on which the analog output signal is based.

5. The source measure unit of claim 1, wherein the digital loop controller is configured to use the digital control signal to adjust the analog output signal if it is determined that the output current is not outside the specified measuring range.

6. The source measure unit of claim 5, wherein the digital loop controller is configured to adjust the analog output signal to regulate a specified function of the output current and the output voltage to remain at a value corresponding to a setpoint.

7. A digital loop controller configured to regulate a specified function of an output current and an output voltage provided to a device under test to remain at a value corresponding to a setpoint, wherein the digital loop control comprises:
- a first input configured to receive a first digital value representative of the output current; and
- a second input configured to receive a second digital value representative of the output voltage;

wherein the digital loop controller is configured to:
- generate a digital control signal based on the first digital value and the second digital value;
- determine based on the first digital value whether the output current is outside a specified measuring range;
- if it is determined that the output current is outside the specified measuring range, generate a digital override signal, and select one of the digital control signal and the digital override signal to obtain a selected digital signal used to regulate the specified function, wherein the selected digital signal effects a faster return of the output current into the specified measuring range.

8. The digital loop controller of claim 7, wherein the digital loop controller is configured to use the digital control signal to adjust an analog output signal to regulate the specified function, if it is determined that the output current is not outside the specified measuring range.

9. The digital loop controller of claim 7, wherein the digital loop controller is configured to generate the digital override signal based on the second digital value, a maximum value associated with the specified measuring range, and a shunt element configured to conduct the output current.

10. The digital loop controller of claim 7, wherein the digital loop controller is configured to select the digital override signal in case of one or more of:
- the output current is positive and the digital override signal is less than the digital control signal; or
- the output current is negative and the digital override signal is greater than the digital control signal.

11. The digital loop controller of claim 7, wherein the digital loop controller is configured to select the digital control signal in case of one or more of:
- the output current is positive and the digital override signal is not less than the digital control signal; or
- the output current is negative and the digital override signal is not greater than the digital control signal.

12. A method for providing an output current and an output voltage to a device for testing the device, the method comprising:
- regulating, via respective digital feedback loops for the output current and the output voltage, a specified function of the output current and the output voltage, said regulating comprising:
  - receiving a first digital value representative of the output current;
  - receiving a second digital value representative of the output voltage;
  - generating a new digital control signal based on the first digital value and the second digital value, comprising:
    - determining based on the first digital value whether the output current is outside a specified measuring range;
    - in response to said determining indicating that the output current is outside the specified measuring range, generating the new digital control signal according to one or more of:
      - the present digital control signal;
      - the second digital value;
      - a specified voltage value associated with the specified measuring range; and
      - a value of a shunt element configured to conduct the output current; and
  - adjusting the output voltage according to the digital control signal.

13. The method of claim 12, wherein said generating the digital control signal further comprises:
- in response to said determining indicating that the output current is not outside the specified measuring range, generating the digital control signal according to one or more of the first digital value or the second digital value, and regulating the specified function to remain at a desired value corresponding to a setpoint according to the digital control signal.

14. The method of claim 13, wherein said regulating the specified function to remain at a desired value comprises one of:
- regulating the output voltage to remain at a desired value corresponding to the setpoint;
- regulating the output current to remain at a desired value corresponding to the setpoint; and
- regulating the output power to remain at a desired value corresponding to the setpoint.

15. A method for testing a device, the method comprising:
- conveying an analog output signal to the device to effect:
  - an output current flowing into the device; and
  - an output voltage across input terminals of the device;
- receiving a first digital value representative of the output current;
- receiving a second digital value representative of the output voltage;
- generating a digital control signal based on the first digital value and the second digital value;
- determining based on the first digital value whether the output current is outside a specified measuring range;
- in response to said determining indicating that the output current is outside the specified measuring range:
  - generating a digital override signal;
  - selecting one of the digital control signal and the digital override signal based on which would effect a faster return of the output current into the specified measuring range; and
  - adjusting the analog output signal using the selected signal.

16. The method of claim 15, wherein said generating the digital override signal comprises determining a value of the digital override signal based on one or more of:
- the second digital value;
- a maximum value associated with the specified measuring range;
- value of a shunt element configured to conduct the output current;
- a specified override value;
- a previous value of the digital control signal; or
- a current value of the digital control signal.

17. The method of claim 15, further comprising performing said generating the digital override signal, said selecting, and said using until the output current is within the specified measuring range.

18. The method of claim 15, further comprising:
- adjusting the analog output signal using the digital control signal, once the output current is within the specified measuring range.

19. A storage medium configured to store programming instructions executable to:
- convey an analog output signal to a device to effect:

an output current flowing into the device; and an output voltage across input terminals of the device;

receive a first digital value representative of the output current;

receive a second digital value representative of the output voltage;

generate a digital control signal based on the first digital value and the second digital value;

determine based on the first digital value whether the output current is outside a specified measuring range;

if the output current is outside the specified measuring range, until the output current is returned to the specified measuring range:

generate a digital override signal;

select one of the digital control signal and the digital override signal according to which of the digital control signal and the digital override signal would effect a faster return of the output current into the specified measuring range; and adjust the analog output signal using the selected signal.

20. The storage medium of claim 19, further configured to store programming instructions executable to:

if the output current is within the specified measuring range, adjust the analog output signal using the digital control signal to regulate a specified function of the output current and the output voltage to remain at a value corresponding to a setpoint.

21. The storage medium of claim 19, further configured to store programming instructions executable to:

calculate a value for the digital override signal from the second digital value, a maximum value associated with the specified measuring range, and a value of a shunt element configured to conduct the output current.

* * * * *